(12) United States Patent
Shindo

(10) Patent No.: US 10,141,279 B2
(45) Date of Patent: Nov. 27, 2018

(54) SEMICONDUCTOR DEVICE AND MANUFACTURING METHOD FOR SEMICONDUCTOR DEVICE

(71) Applicant: LAPIS Semiconductor Co., Ltd., Yokohama (JP)

(72) Inventor: Masanori Shindo, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 15/852,935

(22) Filed: Dec. 22, 2017

(65) Prior Publication Data

US 2018/0182725 A1 Jun. 28, 2018

(30) Foreign Application Priority Data

Dec. 26, 2016 (JP) .................................. 2016-251532

(51) Int. Cl.
*H01L 23/488* (2006.01)
*H01L 23/00* (2006.01)
*H01L 23/498* (2006.01)

(52) U.S. Cl.
CPC .............. *H01L 24/13* (2013.01); *H01L 24/05* (2013.01); *H01L 24/11* (2013.01); *H01L 23/49816* (2013.01); *H01L 23/49838* (2013.01); *H01L 2224/02206* (2013.01); *H01L 2224/0401* (2013.01); *H01L 2224/11013* (2013.01); *H01L 2224/11462* (2013.01); *H01L 2224/13007* (2013.01); *H01L 2224/13021* (2013.01); *H01L 2224/13082* (2013.01)

(58) Field of Classification Search
CPC ......... H01L 23/49838; H01L 23/49816; H01L 24/13

USPC .......................................... 257/737; 438/613
See application file for complete search history.

(56) References Cited

U.S. PATENT DOCUMENTS

| | | | | |
|---|---|---|---|---|
| 2010/0109142 A1* | 5/2010 | Toh | ...................... | H01L 21/486 257/690 |
| 2010/0147573 A1* | 6/2010 | Fukuda | .................. | H01L 21/481 174/260 |
| 2011/0298000 A1* | 12/2011 | Liu | ........................ | H01L 23/481 257/99 |
| 2012/0248599 A1* | 10/2012 | Ring | ....................... | H01L 24/05 257/737 |
| 2015/0255499 A1* | 9/2015 | Lee | .................... | H01L 27/14605 257/432 |
| 2016/0211233 A1* | 7/2016 | Yiu | ......................... | H01L 24/02 |
| 2017/0005069 A1* | 1/2017 | Chen | ................. | H01L 21/76898 |

FOREIGN PATENT DOCUMENTS

JP 2009-212332 A 9/2009

* cited by examiner

*Primary Examiner* — George Fourson, III
(74) *Attorney, Agent, or Firm* — Rabin & Berdo, P.C.

(57) ABSTRACT

A semiconductor device includes a semiconductor substrate, a conductor provided on a main surface of the semiconductor substrate, an insulating layer disposed to cover a surface of the conductor and having a recess from a surface thereof towards the conductor, the recess having an opening provided at a bottom portion of the recess and exposing a portion of the conductor, and an external connection terminal connected to the portion of the conductor exposed from the opening. In a plan view of the semiconductor device, the external connection terminal covers the entire opening, and the entire external connection terminal is within the recess.

16 Claims, 18 Drawing Sheets

PLANNER DIRECTION

PLANNER DIRECTION

SEMICONDUCTOR DEVICE AND MANUFACTURING METHOD FOR SEMICONDUCTOR DEVICE

TECHNICAL FIELD

The present invention relates to a semiconductor device and a manufacturing method for a semiconductor device.

BACKGROUND ART

Semiconductor devices are known in which the surface of the semiconductor substrate has formed thereon an external connection terminal such as a solder bump. In such types of semiconductor device, the conductor constituting wiring lines and the like formed on the surface of the semiconductor substrate is covered by an organic insulating member such as a polyimide, an opening is formed in the insulating member to expose the conductor, and the external connection terminal is connected to the exposed portion of the conductor.

Japanese Patent Application Laid-Open Publication No. 2009-212332, for example, discloses a semiconductor device that includes a topmost metal layer, a solder bump, a metal that connects the topmost metal layer and the solder bump, and a polyimide laminate constituted of a first polyimide layer and a second polyimide layer having formed therein an opening in which the metal is disposed.

SUMMARY OF THE INVENTION

In recent years, semiconductor devices have become increasingly miniaturized, and development has progressed on semiconductor devices including microbumps as external connection terminals with a diameter (a largest diameter in a plan view, hereinafter also referred to as "a size" of the terminal) of 8 to 15 μm. In semiconductor devices including microbumps as the external connection terminals, in order to ensure durability against ion migration, the insulating layer, which is provided in the periphery of the external connection terminal and made of a photosensitive organic insulating member such as a polyimide or PBO (polybenzoxazole), is formed to the same thickness as the insulating layer in semiconductor devices provided with normal size bumps that are larger than microbumps. Ion migration is a phenomenon in which the conductive substance in the interface between the insulating layer and the conductor spreads, and is more likely to occur the thinner the insulating layer covering the conductor is. Therefore, if the thickness of the insulating layer covering the conductor is made thin as well when reducing the size of the solder bump, ion migration is more likely to occur. This poses the risk of anomalies such as short-circuiting between electrodes.

In semiconductor devices provided with a microbump as the external connection terminal, the following problems can occur if the thickness of the insulating layer provided in the periphery of the external connection terminal is formed to the same thickness as an insulating layer in a semiconductor device including a normal size bump.

The first problem is that when performing the plating process for forming the external connection terminal, if an air bubble enters the opening of the insulating layer in which the external connection terminal is formed, it would be difficult to remove the air bubble. If the plating process is performed with the air bubble remaining in the opening, the air bubble can interfere with the plating process.

FIGS. 1A to 1C are cross-sectional views for describing this problem in detail and show one example of a process for forming an external connection terminal.

As shown in FIG. 1A, a rewiring line 200 is formed on the surface of a semiconductor substrate (not shown), and the surface of the rewiring line 200 is covered by an insulating layer 300 made of a photosensitive organic insulating member such as a polyimide or PBO. The insulating layer 300 has formed therein an opening 310 for exposing the surface of the rewiring line 200. The surface of the insulating layer 300, the side face (sidewall) of the opening 310, and the exposed portion of the rewiring line 200 are covered by a plating seed layer 510. A resist mask 600 having an opening where the opening 310 is formed is provided on the insulating layer 300.

During the plating process, a cup-shaped plating device that can simultaneously process multiple wafers is used in order to reduce manufacturing costs. In the cup-shaped plating device, the surface to be plated is soaked in a plating solution with the surface of the semiconductor substrate to be plated facing downward. When an air bubble 100 enters the opening 310, the air bubble interferes with the plating process. In order to handle this situation, the cup-shaped plating device performs an air bubble-removal sequence to remove air bubbles that have entered the recess formed in the surface to be plated as a result of the plating solution being jetted.

However, in a semiconductor device that includes a microbump as the external connection terminal, the width of the opening 310 in the insulating layer 300 is narrow and the openings 310 have a high aspect ratio, and thus, the air bubble 100, which entered the opening 310 in some cases cannot be removed during the air bubble-removal sequence.

If the plating process is performed while the air bubble 100 remains in the opening 310, this can interfere with deposition of the metal by the plating process. In other words, as shown in FIG. 1B, a underlayer 520 that is provided for under-bump metallurgy (UBM) is not formed normally, and a void 521 is formed in the underlayer 520. After this, during the next plating process, a microbump 530 is formed on the surface of the underlayer 520. Then, by performing a reflow process, as shown in FIG. 1C, the microbump 530 is melted and becomes ball-shaped.

Thus, in the semiconductor device including a microbump as the external connection terminal, the openings 310 formed in the insulating layer 300 have a higher aspect ratio, which results in it becoming more difficult to remove air bubbles 100 that have entered the opening 310, which can cause anomalies in the shape of the underlayer 520. If the underlayer 520 is not formed normally, this results in a worsened electrical and mechanical junction between the microbump 530 and the rewiring line 200, which reduces the long-term reliability of the semiconductor device.

The second problem is that in a semiconductor device including a microbump as the external connection terminal, the size of the opening 310 in the insulating layer 300 is smaller compared to when a normal-sized bump is used, and the exposure margin during the photolithography process for forming the opening 310 is small. As a result, there is an increased susceptibility to variation in quality of the opening 310, which can result in an opening defect. If an opening defect occurs, the rewiring line 200 is not exposed sufficiently by the opening 310, which results in increased contact resistance between the external connection terminal and the rewiring line.

The third problem is that during the etching process for removing excess plating seed layer on the insulating layer 300, which is performed after forming the external connection terminal, portions of the plating seed layer 510 covering the side face and bottom surface of the opening 310 in the insulating layer 300 are also removed by etching, which can result in loss of the plating seed layer. FIGS. 2A and 2B are cross-sectional views for describing this problem in detail and show the structure in the periphery of the external connection terminal 500.

In the semiconductor device including the microbump 530 as the external connection terminal 500, an end portion E0 of an opening 310 in the insulating layer 300 in a planar direction parallel to the main surface of the semiconductor substrate, and an end portion EB in a planar direction of the external connection terminal 500 approach each other, and thus, portions of the plating seed layer 510 covering the side face of the opening 310 are susceptible to being exposed. In particular, in the semiconductor device including the microbump 530 as the external connection terminal 500, alignment offset of the mask used during the plating process for forming the external connection terminal 500 results in the portion of the plating seed layer 510 covering the side face of the opening 310 being easily exposed. Also, the plating seed layer 510 covering the side face of the opening 310 has bad film quality as a result of being formed by a normal sputtering process, which means that the etching rate by the etching solution is high. Thus, if the portion of the plating seed layer 510 covering the side face of the opening 310 is exposed to the etching solution, then as shown in the portion encircled by the broken line in FIG. 2A, there is a risk that the portion of the plating seed layer 510 covering the side face of the opening 310 would be removed.

If the portion of the plating seed layer 510 covering the side face of the opening 310 is removed, then a very narrow slit 101 is formed between the insulating layer 300 and the underlayer 520, and the etching solution sometimes remains in the slit 101. It is very difficult to remove the etching solution remaining in the slit 101. The etching solution remaining in the slit 101 gradually eats away at the plating seed layer 510, and there is a risk that even the portion of the plating seed layer 510 between the rewiring line 200 and the underlayer 520 is removed. If the plating seed layer 510 continues to be eaten away, adhesion between the underlayer 520 and the insulating layer 300 and adhesion between the underlayer 520 and the rewiring line 200 decrease, and as shown in FIG. 2B, this poses the risk of the external connection terminal 500 completely detaching.

The fourth problem is that as a result of expansion and contraction of the insulating layer 300 caused by external temperature change, the external connection terminal 500 can peel off. FIGS. 3A and 3B are cross-sectional views for describing this problem in detail and show the structure in the periphery of the external connection terminal 500.

The insulating layer 300 repeatedly expands and contracts as a result of changing surrounding temperatures. As a result of this repeat of expansion and contraction, the laminate constituted of the plating seed layer 510 and the underlayer 520 repeatedly deforms, thus reducing the adhesion between the insulating layer 300 and the plating seed layer 510, and the adhesion between the rewiring line 200 and the plating seed layer 510. In particular, if the insulating layer 300 is thick, then the area of the side face of the opening 310 is large, and thus, the impact on the plating seed layer 510 of expansion and contraction of the insulating layer 300 becomes great, and thus, there is a risk that the plating seed layer 510 is peeled from the insulating layer 300 and the rewiring line 200. As a result, as shown in FIG. 3B, the external connection terminal 500 can be peeled off.

As described above, in order to ensure durability against ion migration in semiconductor devices provided with a microbump as the external connection terminal, if the thickness of the insulating layer provided in the periphery of the external connection terminal is formed to the same thickness as an insulating layer in a semiconductor device including a normal size bump, this results in a decrease in the long-term reliability of the semiconductor device.

The present invention was made in consideration of the above point, and an object thereof is to provide a semiconductor device including an external connection terminal in which it is possible to improve long-term reliability while ensuring durability against ion migration.

According to an aspect of the invention, there is provided a semiconductor device, including a semiconductor substrate, a conductor provided on a main surface of the semiconductor substrate, an insulating layer disposed to cover a surface of the conductor and having a recess from a surface thereof towards the conductor, the recess having an opening provided at a bottom portion of the recess and exposing a portion of the conductor, and an external connection terminal connected to the portion of the conductor exposed from the opening. In a plan view of the semiconductor device, the external connection terminal covers the entire opening, and the entire external connection terminal is within the recess.

According to an aspect of the invention, there is provided a manufacturing method for a semiconductor device, including forming an insulating layer covering a surface of a conductor provided on a main surface of a semiconductor substrate, forming, in the insulating layer, an opening that exposes a portion of the conductor, forming a recess that is recessed towards the conductor from a surface of the insulating layer, a bottom portion of the recess including an entire area of the opening, and forming an external connection terminal connected to the portion of the conductor exposed by the opening. In a plan view of the semiconductor device, the external connection terminal is formed to cover the entire opening, and to be within the recess.

According to the present invention, it is possible to provide a semiconductor device including an external connection terminal in which it is possible to improve long-term reliability while ensuring durability against ion migration.

DETAILED DESCRIPTION OF EMBODIMENTS

Figure 1A:
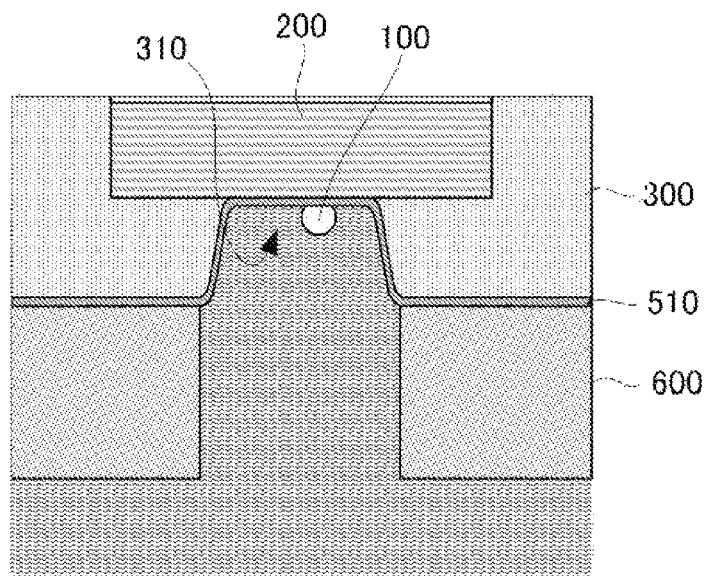
FIG. 1A is a cross-sectional view showing one example of a process for forming an external connection terminal.
Figure 1B:
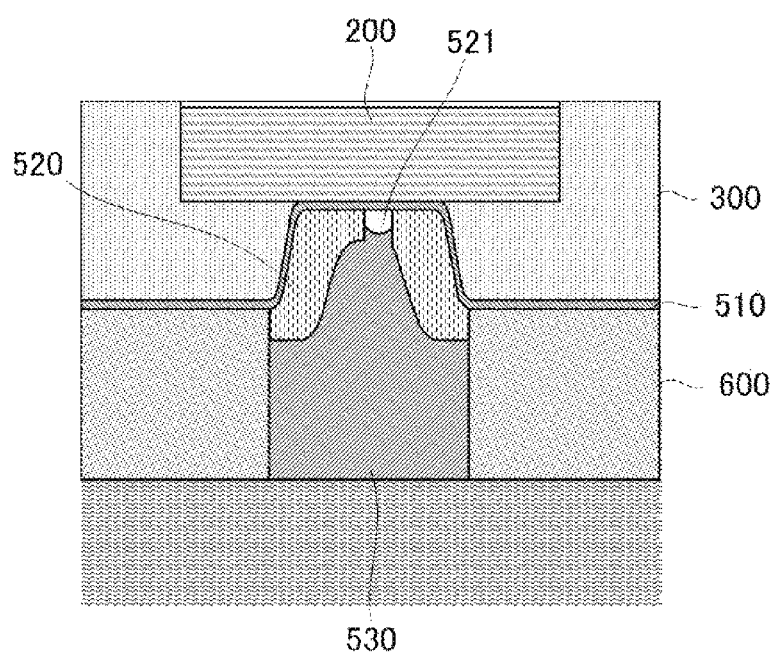
FIG. 1B is a cross-sectional view showing one example of a process for forming an external connection terminal.
Figure 1C:
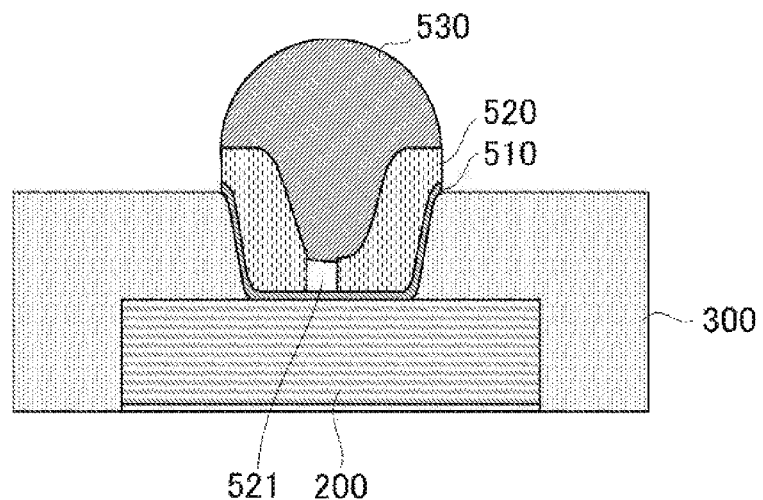
FIG. 1C is a cross-sectional view showing one example of a process for forming an external connection terminal.
Figure 2A:
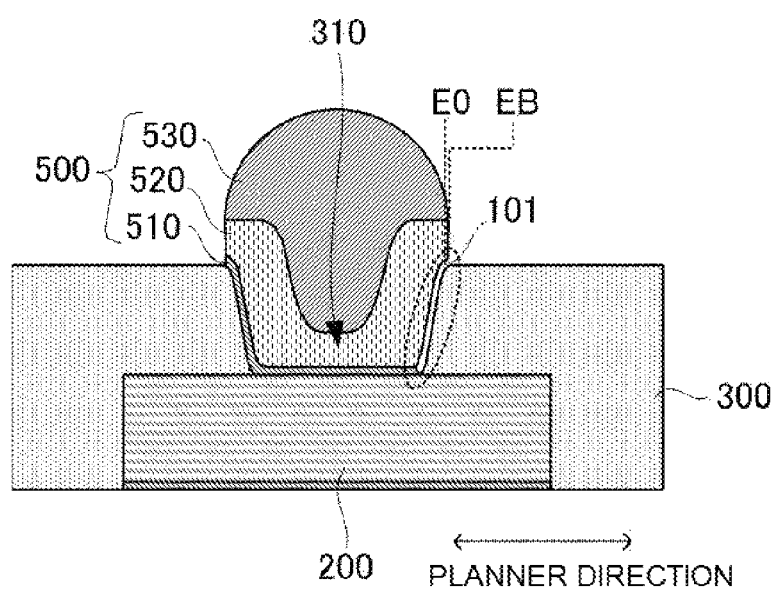
FIG. 2A is a cross-sectional view showing the structure in the periphery of the external connection terminal.
Figure 2B:
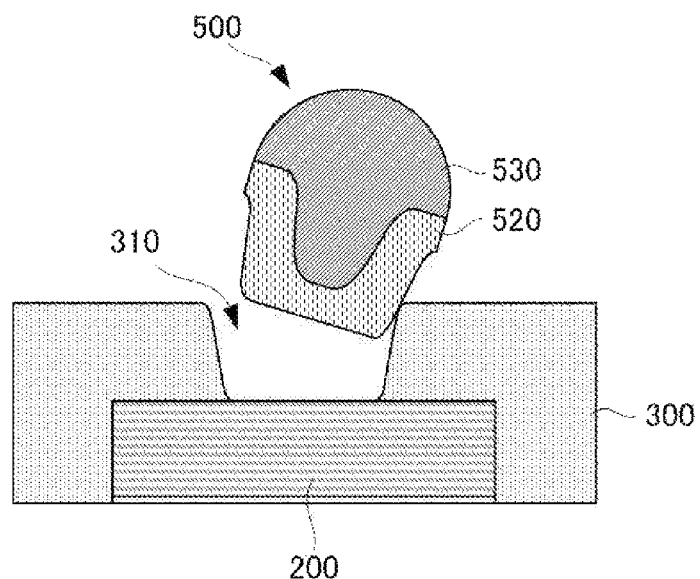
FIG. 2B is a cross-sectional view showing the structure in the periphery of the external connection terminal.
Figure 3A:
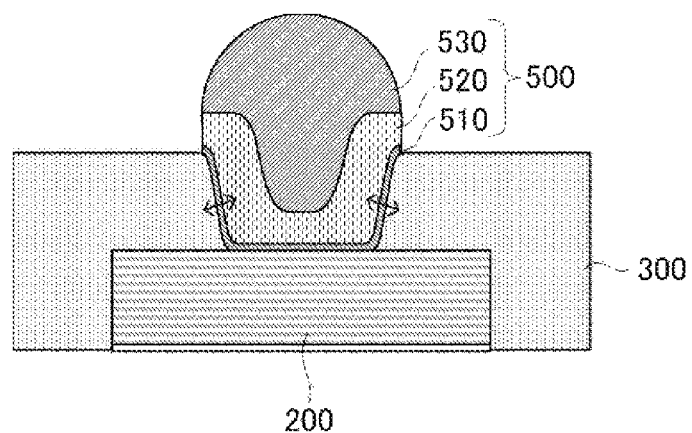
FIG. 3A is a cross-sectional view showing the structure in the periphery of the external connection terminal.
Figure 3B:
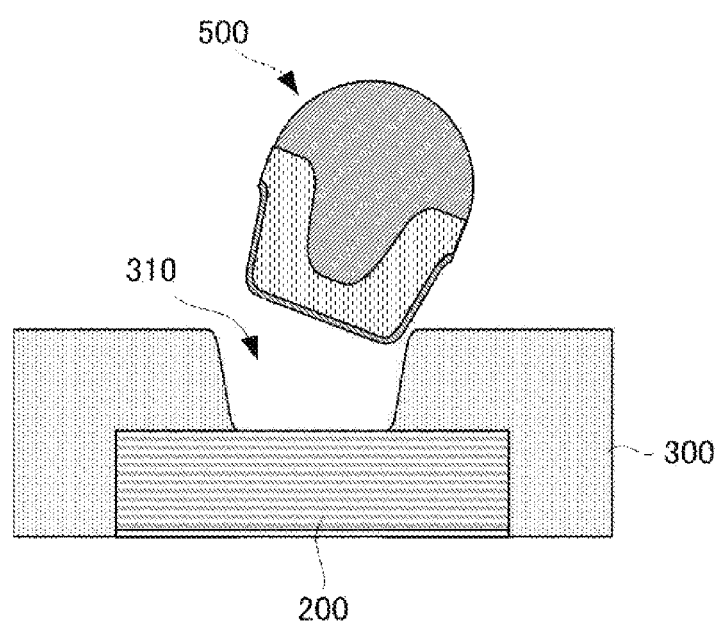
FIG. 3B is a cross-sectional view showing the structure in the periphery of the external connection terminal.

Examples of embodiments of the present invention will be explained below with reference to the drawings. The same or equivalent components and portions in the drawings are assigned the same reference characters and redundant explanations thereof will be omitted.

Embodiment 1

Figure 4:
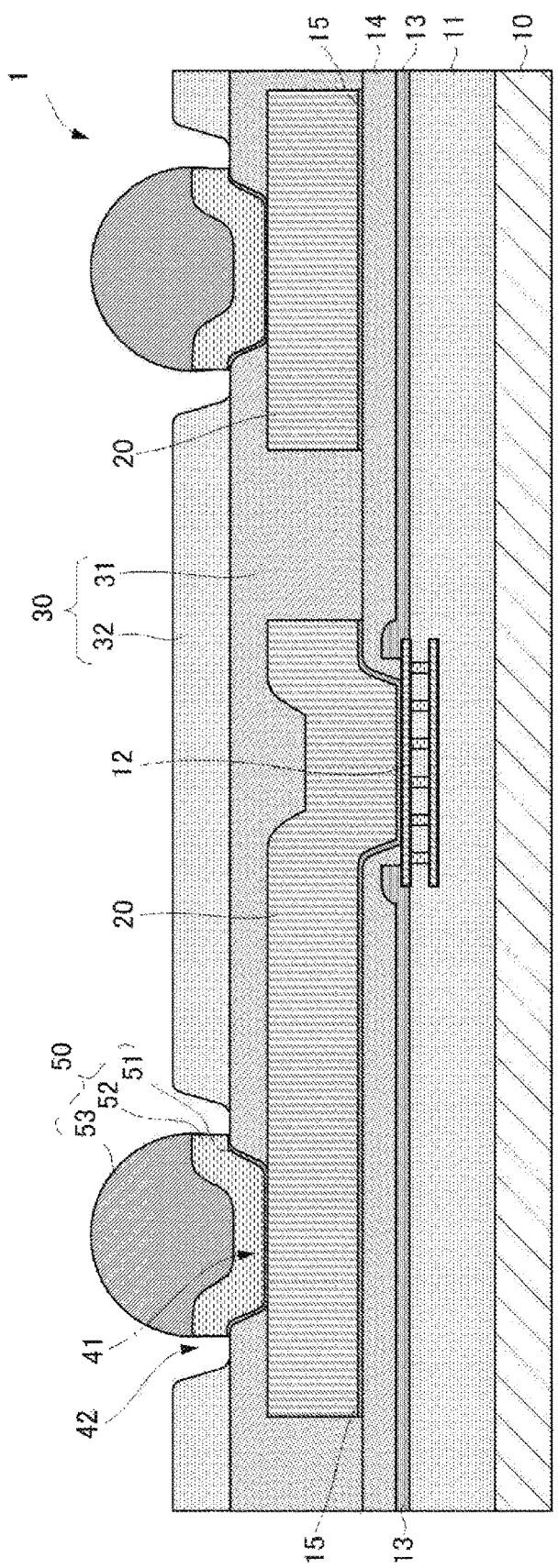
FIG. 4 is a cross-sectional view showing a configuration of a semiconductor device according to an embodiment of the present invention.
Figure 5:
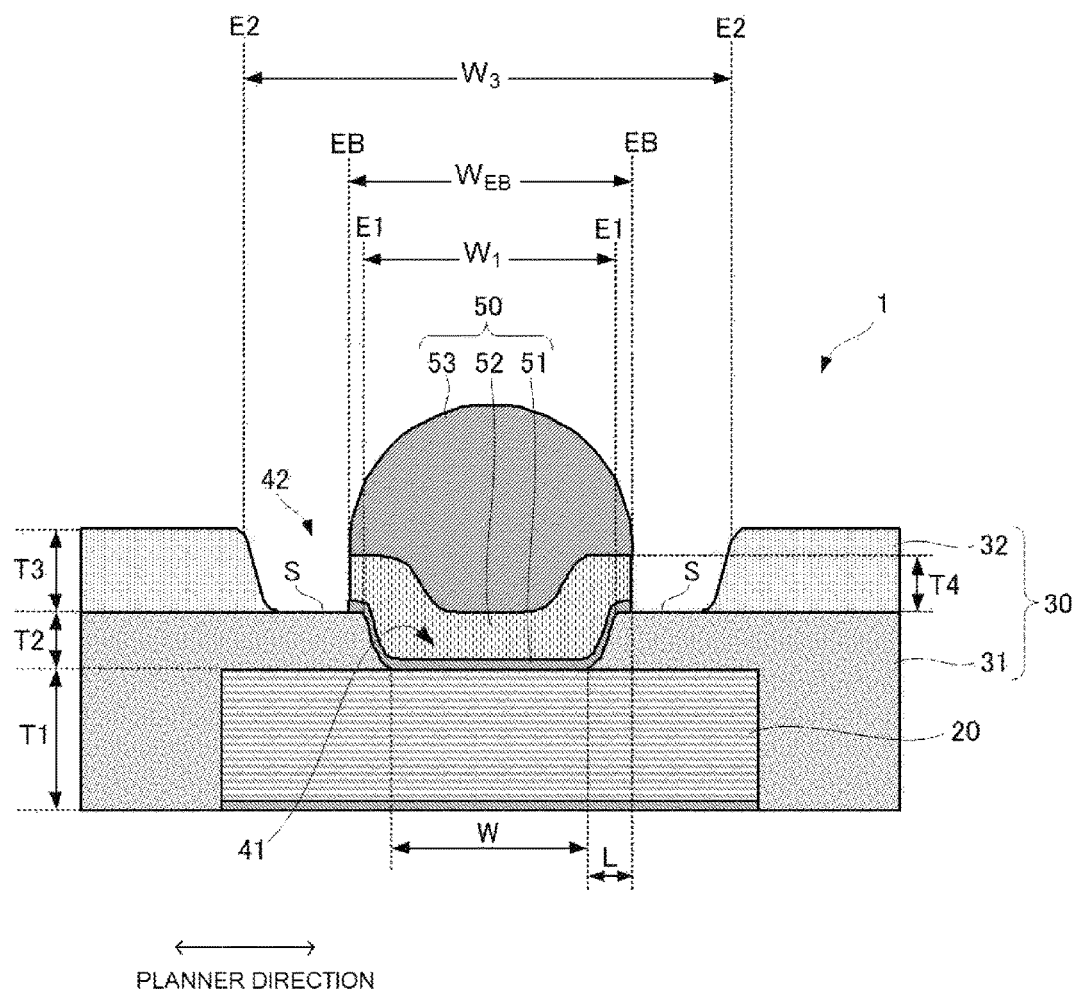
FIG. 5 is a cross-sectional view showing a configuration of a peripheral region of the external connection terminal in the semiconductor device according to an embodiment of the present invention.

FIG. 4 is a cross-sectional view showing a configuration of a semiconductor device 1 according to Embodiment 1 of the present invention. FIG. 5 is a cross-sectional view showing a detailed configuration of an external connection terminal of the semiconductor device.

The semiconductor device 1 includes a semiconductor substrate 10, a rewiring line 20 provided on the semiconductor substrate 10, an insulating layer 30 that covers the surface of the rewiring line 20 and that has an opening 41 that exposes a portion of the rewiring line 20, and an external connection terminal 50 that is connected to the rewiring line 20 through the opening 41.

The surface of the semiconductor substrate 10 has formed thereon circuit elements (not shown) such as transistors, resistors, and capacitors. The surface of the semiconductor substrate 10 is covered by an insulating film 11 made of an insulator such as $SiO_2$. The surface of the insulating film 11 is provided with an electrode pad 12 that is connected to the circuit elements formed on the semiconductor substrate 10 and a passivation film 13 having an opening that exposes a portion of the surface of the electrode pad 12.

The surface of the passivation film 13 is covered by a surface protective layer 14 made of a photosensitive organic insulating member such as a polyimide or PBO (polybenzoxazole). The surface protective layer 14 is provided with an opening that exposes a portion of the surface of the electrode pad 12.

The surface of the surface protective layer 14 is provided with the rewiring line 20 with a plating seed layer 15 sandwiched therebetween. The plating seed layer 15 is made of a multilayer film including a Ti film and a Cu film, for example, and the rewiring line 20 is made of a conductor such as Cu, for example. The rewiring line 20 is connected to the electrode pad 12 in the opening of the surface protective layer 14. A thickness T1 of the rewiring line 20 is approximately 5 μm, for example.

In the present embodiment, the insulating layer 30 covering the surface of the rewiring line 20 includes a first insulating film 31 and a second insulating film 32. The first insulating film 31 and the second insulating film 32 are both formed of a photosensitive organic insulating member such as a polyimide or PBO.

The first insulating film 31 covers the surface of the rewiring line 20. Also, the first insulating film 31 has a first opening 41 that exposes a portion of the rewiring line 20. A thickness T2 of the portion of the first insulating film 31 covering the surface of the rewiring line 20 is approximately 2 µm, for example, and a width W of the first opening 41 is approximately 7 µm, for example. The side face (sidewall) of the first opening 41 is formed as an inclined surface, and the cross-sectional shape of the first opening 41 is a forward tapered shape. In other words, the diameter of the first opening 41 is gradually reduced from the surface side of the first insulating film 31 towards the rewiring line 20.

The second insulating film 32 covers the surface of the first insulating film 31. Also, the second insulating film 32 has a second opening 42 that exposes a region of the first insulating film 31 including the first opening 41. In other words, the first opening 41 is provided to the inside of the second opening 42. A thickness T3 of the portion of the second insulating film 32 covering the surface of the first insulating film 31 is approximately 3 µm, for example. The side face (sidewall) of the second opening 42 is formed as an inclined surface, and the cross-sectional shape of the second opening 42 is a forward tapered shape. In other words, the diameter of the second opening 42 is gradually reduced from the surface side of the second insulating film 32 towards the rewiring line 20.

The external connection terminal 50 includes the plating seed layer 51, the underlayer 52, and the bump 53. The external connection terminal 50 is connected to a portion of the rewiring line 20 exposed by the first opening 41, and is disposed inside the second opening 42.

The plating seed layer 51 is a conductor layer for forming the underlayer 52 by electroplating, and is made of a multilayer film including a Ti film and a Cu film, for example. The underlayer 52 is a metal layer provided for under-bump metallurgy (UBM), and is made of a metal such as Ni and formed on the surface of the plating seed layer 51. A thickness T4 of the laminate constituted of the plating seed layer 51 and the underlayer 52 is approximately 2 µm, for example. The bump 53 is a microbump with a diameter of approximately 10 µm and has a ball shape. The bump 53 is made of a solder material such as Sn—Ag, for example, and is formed on the surface of the underlayer 52.

An end portion EB of the external connection terminal 50 in the planar direction parallel to the main surface of the semiconductor substrate 10 is to the outside of an end portion E1 in the planar direction of the first opening 41 formed in the first insulating film 31, and is disposed to the inside of an end portion E2 in the planar direction of the second opening 42 formed in the second insulating film 32. Also, an overlapping length L in the planar direction of the first insulating film 31 and the external connection terminal 50 is approximately 1.5 µm. That is, in a plan view of the semiconductor device 1, the external connection terminal 50 covers the entire first opening 41, and the entire external connection terminal 50 is within the recess. As shown in FIG. 5, in a direction parallel to the main surface of the semiconductor substrate 10, i.e., in a plan view, a largest diameter (first largest diameter) $W_3$ of the second opening (recess) 42 is greater than a largest diameter (second largest diameter) $W_{EB}$ of the external connection terminal 50 that is greater than a largest diameter (third largest diameter) $W_1$ of the first opening 41. The end points E1, the end points EB, and the end points E2 respectively constitute end points of the first to third largest diameters.

In the semiconductor device 1, the insulating layer 30 constituted of the first insulating film 31 and the second insulating film 32 has the first opening 41 formed in the first insulating film 31 as the opening for exposing a portion of the rewiring line 20. The insulating layer 30 has a recessed portion that is recessed from the surface of the insulating layer 30 towards the rewiring line 20, the recessed portion being formed by the second opening 42 formed in the second insulating film 32. In the insulating layer 30, the opening (first opening 41) that exposes a portion of the rewiring line 20 is disposed at the bottom of the recess (second opening 42). Also, in the semiconductor device 1, the end portion EB in the planar direction of the external connection terminal 50 is disposed on a wall surface S of the recess formed by the second opening 42. In the present embodiment, the surface of the first insulating film 31 exposed in the second opening 42 functions as the wall surface S of the recess.

Also, in the semiconductor device 1, the thickness of the insulating layer 30, constituted of the first insulating film 31 and the second insulating film 32, covering the surface of the rewiring line 20 increases in thickness in a stepwise fashion from the end portion E1 of the first opening 41 towards the outside of the first opening 41. In other words, the insulating layer 30 has a thin portion where only the first insulating film 31 covers the rewiring line 20, and a thick portion where both the first insulating film 31 and the second insulating film 32 cover the rewiring line 20, and the external connection terminal 50 is formed on the thin portion of the insulating layer 30.

Below a manufacturing method for the semiconductor device 1 will be described. FIGS. 6A to 6M are cross-sectional views showing an example of a manufacturing method for the semiconductor device 1.

Figure 6A:
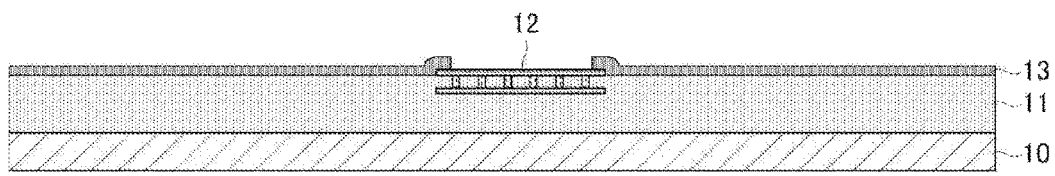
FIG. 6A is a cross-sectional view showing a manufacturing method for a semiconductor device according to an embodiment of the present invention.

First, by a publicly known process, circuit elements such as transistors, resistors, and capacitors are formed on the semiconductor substrate 10. Next, the insulating film 11 and a metal film are layered alternately to form a multilayer wiring structure on the surface of the semiconductor substrate 1. The insulating film 11 is formed on the surface of the semiconductor substrate 10 by depositing an insulator such as $SiO_2$ by the publicly known CVD (chemical vapor deposition) process, for example. The surface of the insulating film 11 has formed thereon the electrode pad 12, which is connected to the circuit elements formed on the semiconductor substrate 10. Then, the passivation film 13 is formed so as to expose a portion of the surface of the electrode pad 12 (FIG. 6A).

Figure 6B:
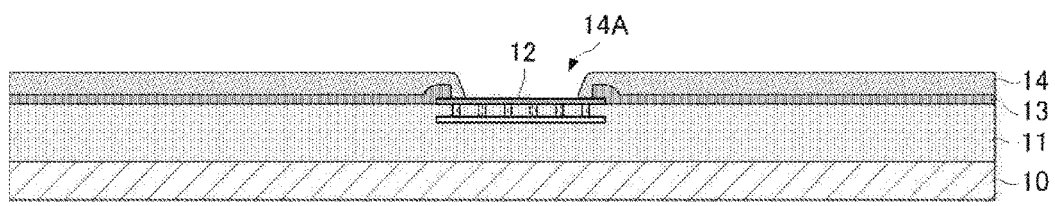
FIG. 6B is a cross-sectional view showing a manufacturing method for a semiconductor device according to an embodiment of the present invention.

Next, a photosensitive organic insulating member such as a polyimide or PBO is coated by spin coating onto the surface of the structure formed by the above processes, thereby forming the surface protective layer 14 covering the surface of the passivation film 13 and the electrode pad 12. Next, by the publicly known photolithography technique, the opening 14A exposing a portion of the surface of the electrode pad 12 is formed in the surface protective layer 14. Then, the surface protective layer 14 is cured by heat treatment (FIG. 6B).

Figure 6C:
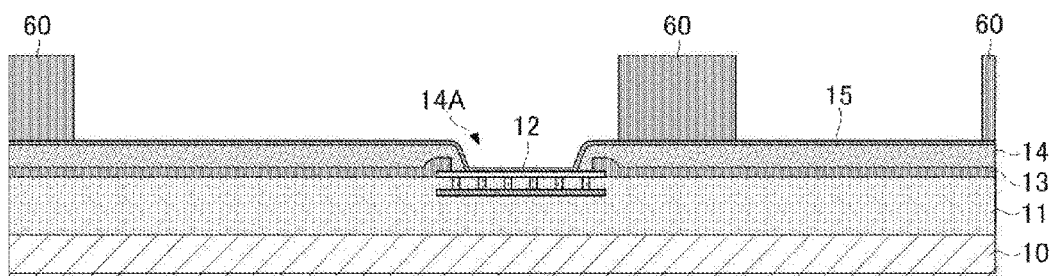
FIG. 6C is a cross-sectional view showing a manufacturing method for a semiconductor device according to an embodiment of the present invention.

Next, the plating seed layer 15 covering the surface of the surface protective layer 14 and the side face and bottom surface of the opening 14A is formed. The plating seed layer 15 is formed by sequentially depositing a Ti film and a Cu film by sputtering, for example. Then, using the publicly known photolithography technique, a resist mask 60 corresponding to the pattern of the rewiring line is formed on the surface of the plating seed layer 15 (FIG. 6C).

Figure 6D:
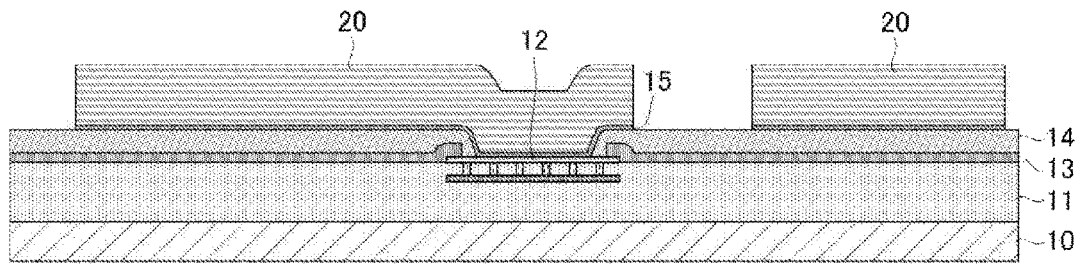
FIG. 6D is a cross-sectional view showing a manufacturing method for a semiconductor device according to an embodiment of the present invention.

Next, the rewiring line 20 is formed on the surface of the plating seed layer 15 by electroplating. Specifically, the surface of the semiconductor substrate 10 is soaked by a plating solution and a voltage is applied to the plating seed layer 15. As a result, metal is deposited on the exposed portion of the plating seed layer 15, thereby forming the rewiring line 20. Cu can be used as a material for the rewiring line 20, for example. Then, the resist mask 60 is removed and excess plating seed layer 15 is removed using the rewiring line 20 as a mask (FIG. 6D).

Figure 6E:
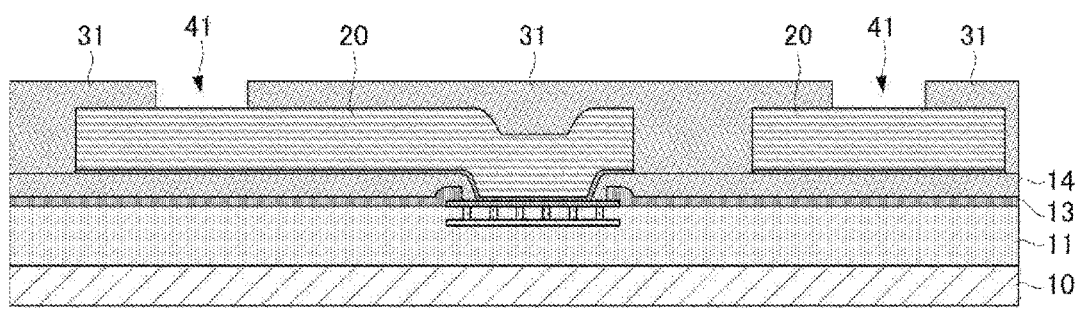
FIG. 6E is a cross-sectional view showing a manufacturing method for a semiconductor device according to an embodiment of the present invention.

Next, a photosensitive organic insulating member such as a polyimide or PBO is coated by spin coating onto the surface of the structure formed by the above processes, thereby forming the first insulating film 31 covering the surface of the rewiring line 20 and the surface protective layer 14. Then, by the publicly known photolithography technique, the first opening 41 exposing a portion of the rewiring line 20 is formed in the first insulating film 31. The first insulating film 31 is deposited by spin coating, and thus, a flat surface is formed on the rewiring line 20 (FIG. 6E).

Figure 6F:
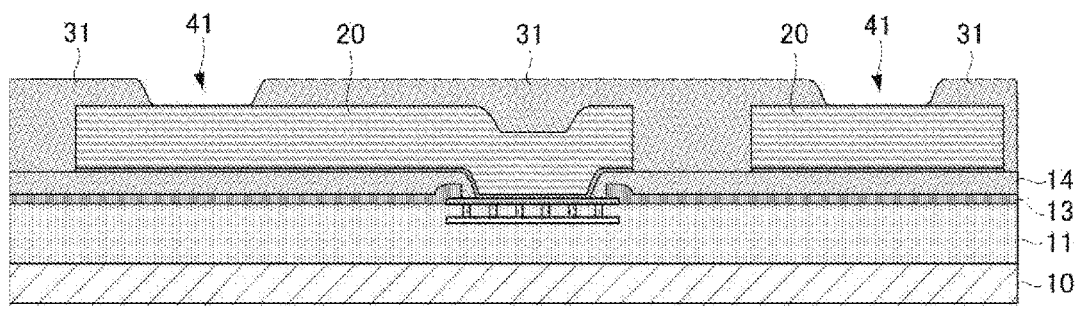
FIG. 6F is a cross-sectional view showing a manufacturing method for a semiconductor device according to an embodiment of the present invention.

Next, by performing heat treatment on the first insulating film 31, the first insulating film 31 is cured. Heat treatment causes thermal contraction of the first insulating film 31, and the side face of the first opening 41, which was substantially vertical prior to curing, becomes an inclined surface that is inclined in a diagonal direction. In other words, the cross-sectional shape of the first opening 41 is a forward tapered shape after curing (FIG. 6F).

Figure 6G:
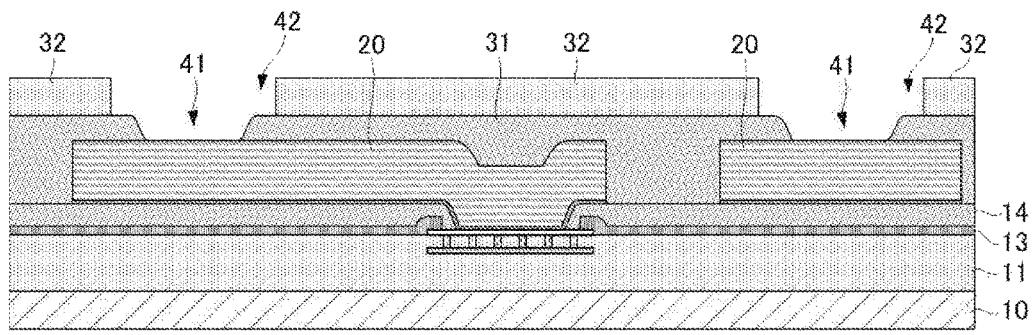
FIG. 6G is a cross-sectional view showing a manufacturing method for a semiconductor device according to an embodiment of the present invention.

Next, a photosensitive organic insulating member such as a polyimide or PBO is coated by spin coating onto the surface of the structure formed by the above processes, thereby forming the second insulating film 32 covering the exposed portion of the first insulating film 31 and the rewiring line 20. Then, by the publicly known photolithography technique, the second opening 42 exposing a region including the first opening of the first insulating film is formed in the second insulating film 32. In the second opening 42, the surface of the first insulating film 31, the side face of the first opening 41, and a portion of the rewiring line 20 exposed by the first opening 41 are exposed (FIG. 6G).

Figure 6H:
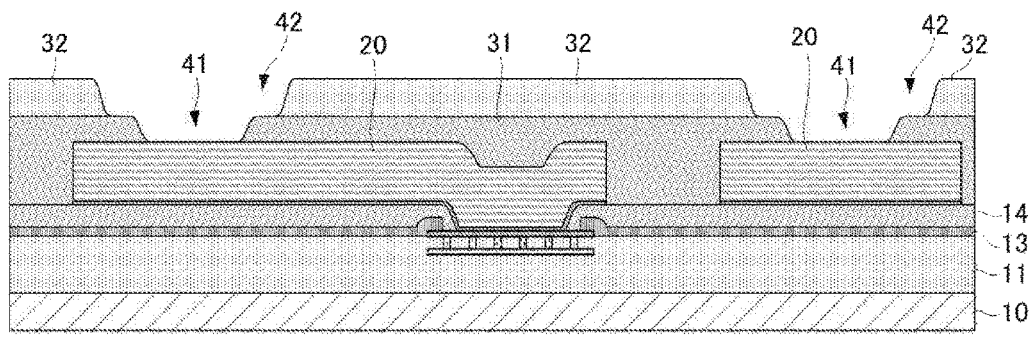
FIG. 6H is a cross-sectional view showing a manufacturing method for a semiconductor device according to an embodiment of the present invention.

Next, by performing heat treatment on the second insulating film 32, the second insulating film 32 is cured. Heat treatment causes thermal contraction of the second insulating film 32, and the side face of the second opening 42, which was substantially vertical prior to curing, becomes an inclined surface that is inclined in a diagonal direction. In other words, the cross-sectional shape of the second opening 42 is a forward tapered shape after curing (FIG. 6H).

Figure 6I:
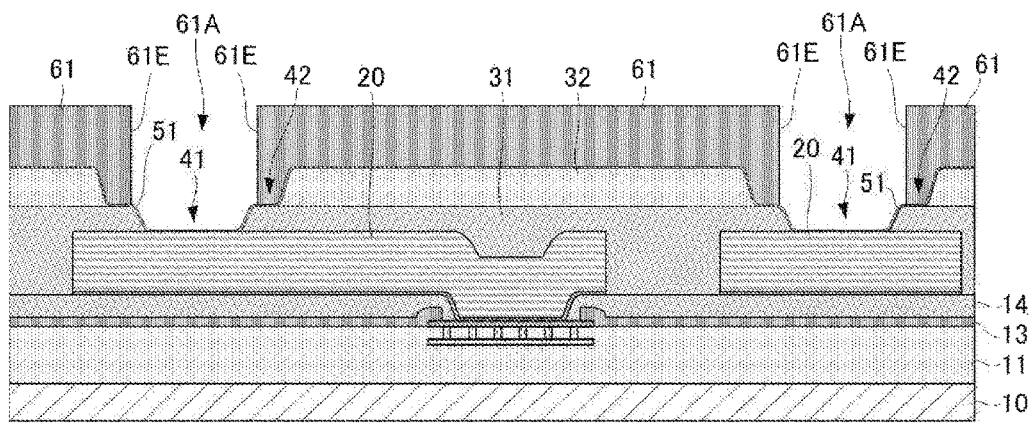
FIG. 6I is a cross-sectional view showing a manufacturing method for a semiconductor device according to an embodiment of the present invention.

Next, by the sputtering method, a Ti film and a Cu film are sequentially deposited on the surface of the structure formed by the processes above, thereby forming the plating seed layer 51 covering the surface of the second insulating film 32, the side face of the second opening 42, the surface of the first insulating film 31 exposed by the second opening 42, the side face of the first opening 41, and the exposed portion of the rewiring line 20. Then, by the publicly known photolithography technique, a resist mask 61 having an opening 61A exposing the exposed portion of the rewiring line 20 is formed. An end portion 61E of the opening 61A of the resist mask 61 is disposed on the surface of the first insulating film exposed by the second opening 42 (FIG. 6I).

Figure 6J:
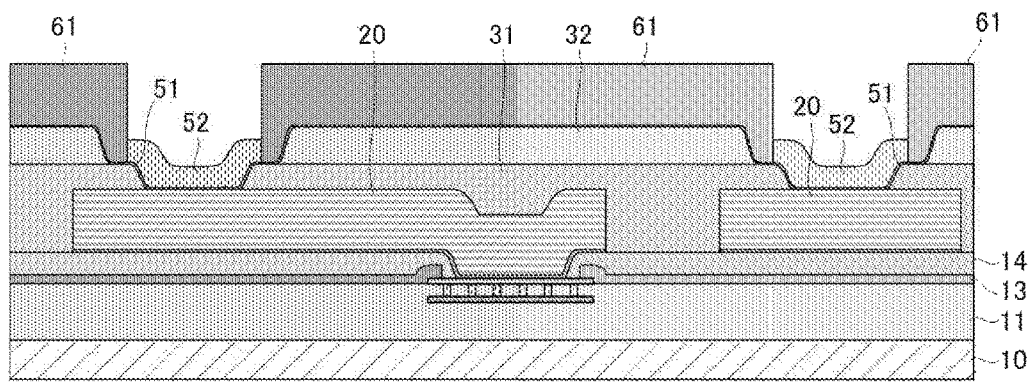
FIG. 6J is a cross-sectional view showing a manufacturing method for a semiconductor device according to an embodiment of the present invention.

Next, the underlayer 52 is formed on the exposed portion of the plating seed layer 51 by electroplating. During the plating process, a cup-shaped plating device that can simultaneously process multiple wafers is used. In the cup-shaped plating device, the surface to be plated is soaked in a plating solution with the surface of the semiconductor substrate 10 to be plated facing downward. If there is a recess in the surface to be plated, an air bubble enters the recessed area, interfering with the plating process. In order to handle this situation, the cup-shaped plating device performs an air bubble-removal sequence to remove air bubbles that have entered the recess as a result of the plating solution being jetted. According to the semiconductor device 1 and the manufacturing method therefor of the present embodiment, the first opening 41 exposing the rewiring line 20 is formed in a portion where the rewiring line 20 is covered only by the first insulating film 31. As a result, the aspect ratio of the first openings 41 can be made smaller than in conventional configurations. Therefore, air bubbles that have entered the first opening 41 can be easily removed by an air bubble-removal sequence. In this manner, it is possible to reduce the risk of the plating process being performed while air bubbles that have entered the first opening 41 remain. After the air bubble-removal sequence has been completed, a voltage is applied to the plating seed layer 51. As a result, metal is deposited on the exposed portion of the plating seed layer 51, thereby forming the underlayer 52. Ni, for example, can be suitably used as a member for the underlayer 52 (FIG. 6J).

Figure 6K:
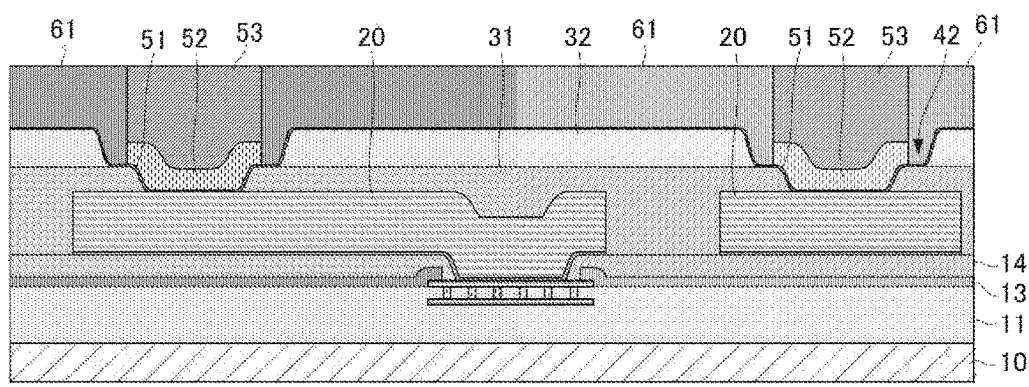
FIG. 6K is a cross-sectional view showing a manufacturing method for a semiconductor device according to an embodiment of the present invention.

Next, the bump 53 is formed on the underlayer 52 by electroplating. Specifically, the surface of the semiconductor substrate 10 is soaked by plating solution while leaving remaining the resist mask 61 used when forming the underlayer 52, and a voltage is applied to the plating seed layer 51. As a result, metal is deposited on the surface of the underlayer 52, thereby forming the bump 53. Sn—Ag, for example, can be suitably used as a member for the bump 53 (FIG. 6K).

Figure 6L:
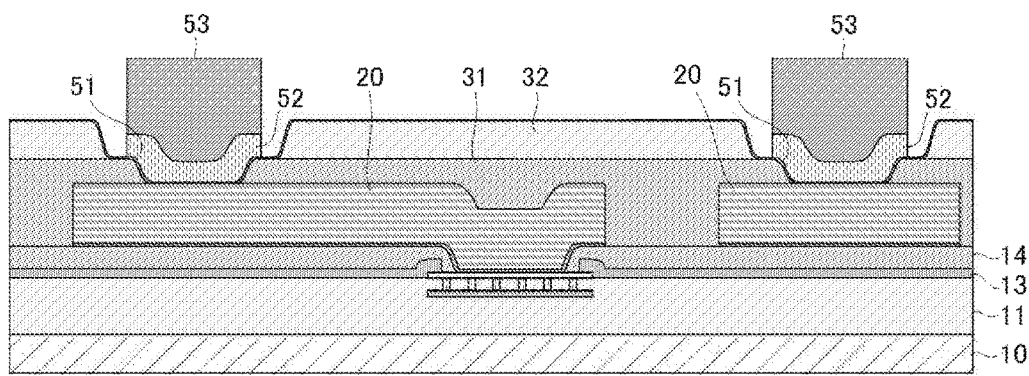
FIG. 6L is a cross-sectional view showing a manufacturing method for a semiconductor device according to an embodiment of the present invention.
Figure 6M:
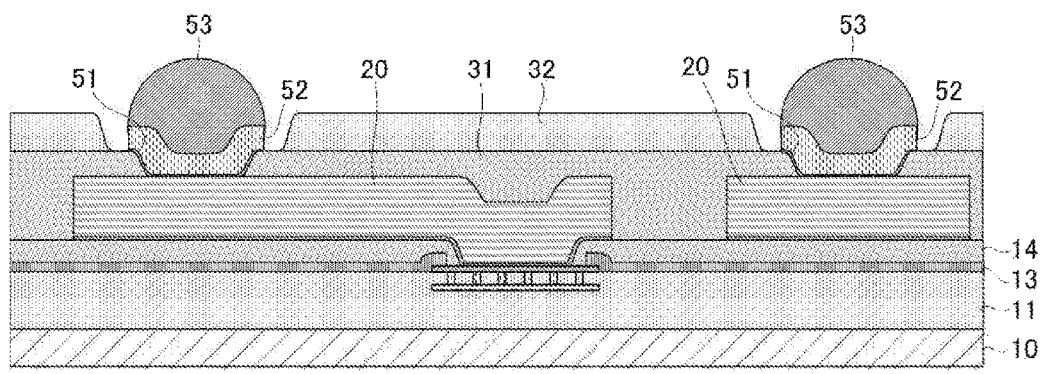
FIG. 6M is a cross-sectional view showing a manufacturing method for a semiconductor device according to an embodiment of the present invention.

Next, the resist mask 61 used during the plating process in order to form the underlayer 52 and the bump 53 is removed (FIG. 6L).

Next, excess plating seed layer remaining on the surface of the first insulating film 31 and the surface of the second insulating film is removed by etching with the underlayer 52 as a mask. Then, a reflow process is performed and the bump 53 is temporarily melted. As a result, the bump 53 is formed into a ball shape.

According to the semiconductor device 1 and the manufacturing method therefor of an embodiment of the present invention, the thickness of the insulating layer 30 covering the surface of the rewiring line 20 is thinner in a portion where the external connection terminal 50 is formed and thicker in other portions. As a result, compared to a case in which the entire insulating layer 30 is formed to be thin, it is possible to increase durability against ion migration.

According to the semiconductor device 1 and the manufacturing method therefor of the present embodiment, the first opening 41 exposing the rewiring line 20 is formed in a portion where the rewiring line 20 is covered only by the first insulating film 31. In other words, the first opening 41 is formed on the bottom surface of the recess formed in the surface of the insulating layer 30 by the second opening 42. As a result, the aspect ratio of the first openings 41 can be made smaller than in conventional configurations. Therefore, it becomes easy to remove air bubbles that have entered the first opening 41 by the air bubble-removal sequence, and it is possible to reduce the risk of the plating process being performed while air bubbles that have entered the first opening 41 remain. By the air bubbles being reliably removed, it is possible to form a normal underlayer 52 by the plating process.

Also, according to the semiconductor device 1 and the manufacturing method therefor of the present embodiment, the insulating layer 30 at a portion where the first opening 41 exposing the rewiring line 20 is formed is made to be thinner than in conventional configurations. In this manner, it is possible to increase the exposure margin when forming the first opening 41 and to mitigate the occurrence of opening defects. Thus, it is possible to stabilize the contact resistance between the external connection terminal 50 and the rewiring line 20.

Also, according to the semiconductor device 1 and the manufacturing method therefor of the present embodiment, the insulating layer 30 has the first opening 41, which exposes the rewiring line 20 at the bottom of the recess formed by the second opening 42. In this manner, by using a two-step structure including the recess formed by the second opening 42 and the first opening 41 for the opening that spans from surface of the insulating layer 30 to the rewiring line 20, it is possible to dispose the end portion EB in the planar direction of the external connection terminal 50 on the wall surface S of the recess formed by the second opening 42. In this manner, it is possible to set the distance between the end portion E1 in the planar direction of the first opening 41, which exposes the rewiring line 20, and the end portion EB in the planar direction of the external connection terminal 50, so as to be longer than in conventional configurations. As a result, the portion of the plating seed layer 51 covering the side face of the first opening 41 is not exposed to the etching solution for removing the plating seed layer 51, and thus, it is possible to mitigate complete elimination of the plating seed layer 51.

Also, according to the semiconductor device 1 and the manufacturing method therefor of the present embodiment, the contact area between the insulating layer 30 and the external connection terminal 50 is less than in conventional configurations, and thus, the effect of expansion and contraction of the insulating layer 30 resulting from changes in the surrounding temperature on the external connection terminal 50 is reduced. In this manner, it is possible to suppress peeling of the external connection terminal 50. Thus, it is possible to improve the long-term reliability of the semiconductor device 1.

Figure 7:
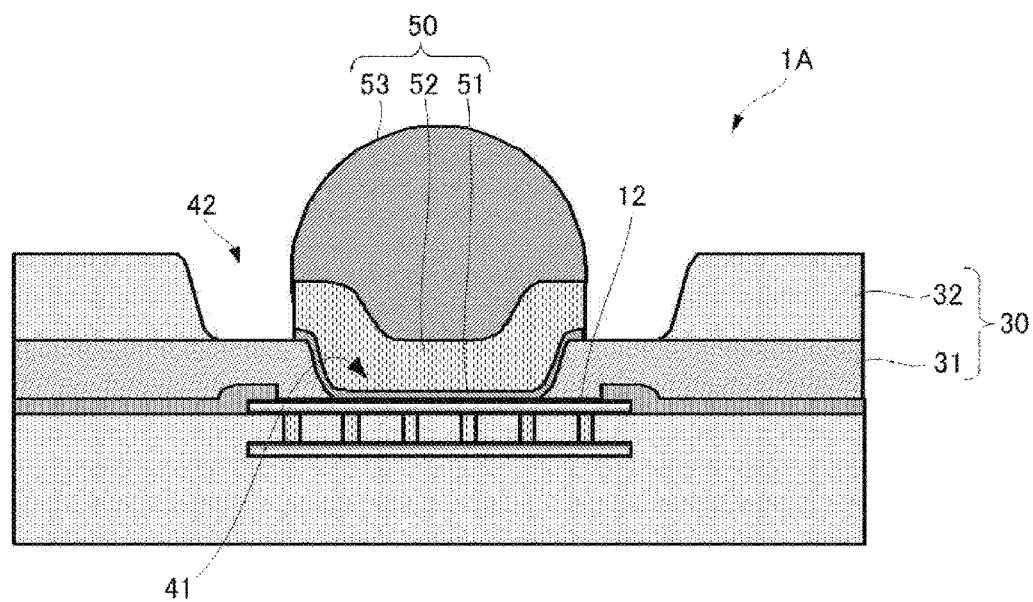
FIG. 7 is a cross-sectional view showing a configuration of a peripheral region of the external connection terminal in the semiconductor device according to another embodiment of the present invention.

FIG. 7 is a cross-sectional view showing a configuration of a peripheral region of an external connection terminal of the semiconductor device 1A according to a modification example. The semiconductor device 1A of the modification example differs from the semiconductor device 1 (see FIG. 5) in that the external connection terminal 50 is connected to the electrode pad 12. Even in the semiconductor device 1A having such a configuration in which the external connection terminal 50 is connected to the electrode pad 12, similar effects to the above-mentioned semiconductor device 1 can be attained.

Embodiment 2

Figure 8:
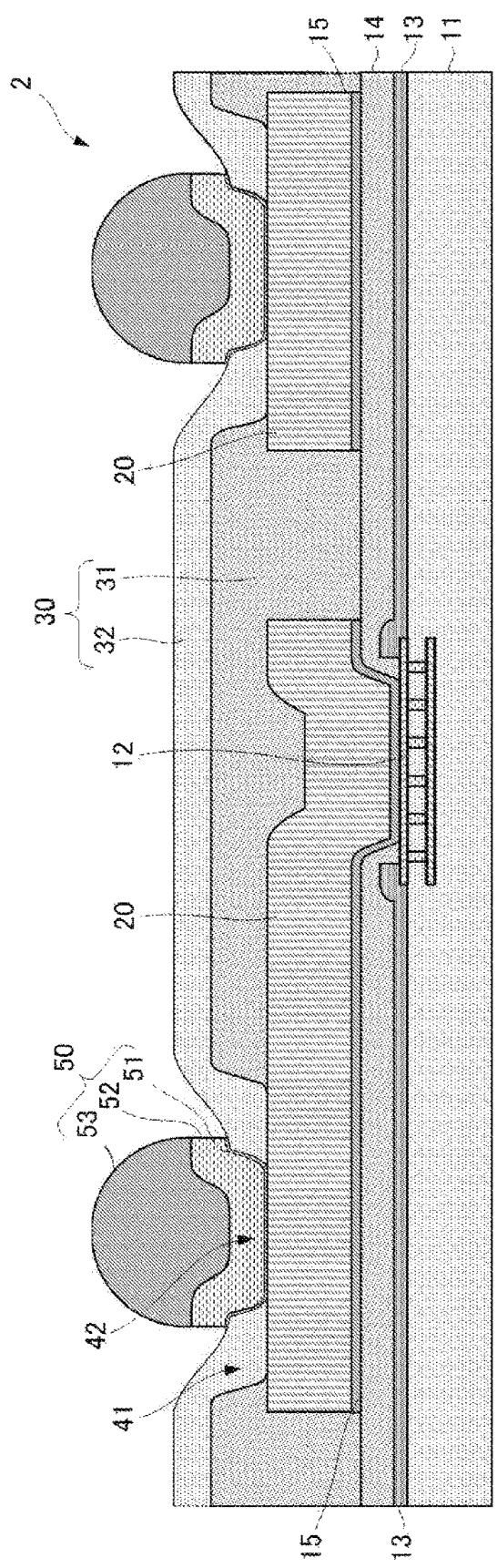
FIG. 8 is a cross-sectional view showing a configuration of a semiconductor device according to another embodiment of the present invention.
Figure 9:
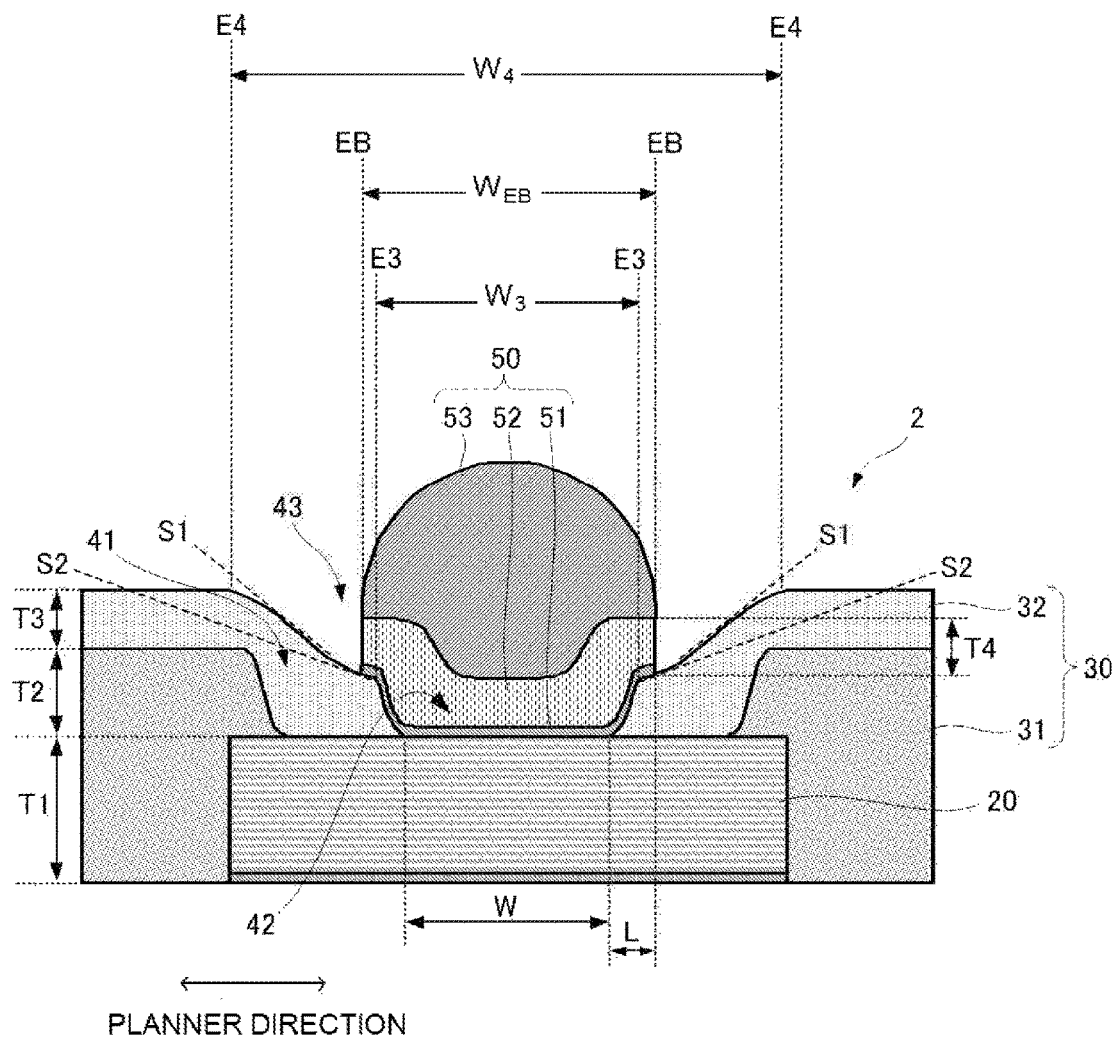
FIG. 9 is a cross-sectional view showing a configuration of a peripheral region of the external connection terminal in the semiconductor device according to another embodiment of the present invention.

FIG. 8 is a cross-sectional view showing a configuration of a semiconductor device 2 according to Embodiment 2 of the present invention. FIG. 9 is a cross-sectional view showing a detailed configuration of an external connection terminal of the semiconductor device. The semiconductor device 2 according to Embodiment 2 differs from Embodiment 1 in terms of the configuration of the insulating layer 30 covering the surface of the rewiring line 20.

Similar to the semiconductor device 1 of Embodiment 1, the insulating layer 30 covering the surface of the rewiring line 20 includes a first insulating film 31 and a second insulating film 32. The first insulating film 31 and the second insulating film 32 are both formed of a photosensitive organic insulating member such as a polyimide or PBO.

The first insulating film 31 covers the surface of the rewiring line 20. Also, the first insulating film 31 has a first opening 41 that exposes a portion of the rewiring line 20. A thickness T2 of the portion of the first insulating film 31 covering the surface of the rewiring line 20 is approximately 3 μm, for example. The side face of the first opening 41 is formed as an inclined surface, and the cross-sectional shape of the first opening 41 is a forward tapered shape. In other words, the diameter of the first opening 41 is gradually reduced from the surface side of the first insulating film 31 towards the rewiring line 20.

The second insulating film 32 covers the surface of the first insulating film 31. A thickness T3 of the portion of the second insulating film 32 covering the surface of the first insulating film 31 is approximately 2 μm, for example. The second insulating film 32 has a recess 43 that is recessed towards the rewiring line 20 in a portion corresponding to the first opening 41 formed in the first insulating film 31. The wall surface of the recessed portion 43 is a curved and shallow inclined surface, and has a first inclined surface S1 and a second inclined surface S2 that has an angle of inclination shallower than the first inclined surface S1. Also, the second insulating film 32 has a second opening 42 that exposes a portion of the surface of the rewiring line 20, at the bottom of the recess 43. In other words, the second opening 42 is encompassed by the first opening 41. A width W of the second opening 42 is approximately 7 μm, for example. The side face of the second opening 42 is formed as an inclined surface S3 having a steeper angle of inclination than the first inclined surface S1, and the cross-sectional shape of the second opening 42 is a forward tapered shape. In other words, the diameter of the second opening 42 is gradually reduced from the surface side of the second insulating film 32 towards the rewiring line 20.

The external connection terminal 50 includes the plating seed layer 51, the underlayer 52, and the bump 53. The external connection terminal 50 is connected to a portion of the rewiring line 20 exposed by the second opening 42, and is disposed inside the recess 43. A thickness T4 of the laminate constituted of the plating seed layer 51 and the underlayer 52 is approximately 2 μm, for example. The bump 53 is a microbump with a diameter of approximately 10 μm and has a ball shape.

An end portion EB of the external connection terminal 50 in the planar direction parallel to the main surface of the semiconductor substrate 10 is to the outside of an end portion E3 in the planar direction of the second opening 42 formed in the second insulating film 32, and is disposed to the inside of an end portion E4 in the planar direction of the recess 43 formed in the second insulating film 32. Also, an overlapping length L in the planar direction of the second insulating film 32 and the external connection terminal 50 is approximately 1.5 μm. That is, in a plan view of the semiconductor device 1, the external connection terminal 50 covers the entire second opening 42, and the entire external connection terminal 50 is within the recess 43. As shown in FIG. 9, in the plan view, a largest diameter (fourth largest diameter) $W_4$ of the recess 43 is greater than the largest diameter (second largest diameter) $W_{EB}$ of the external connection terminal 50 that is greater than a largest diameter (fifth largest diameter) $W_3$ of the second opening 42. The end points E4 and the end points E3 respectively constitute end points of the fourth and fifth largest diameters.

In the semiconductor device 2, the insulating layer 30 constituted of the first insulating film 31 and the second insulating film 32 has the second opening 42 formed in the second insulating film 32 as the opening for exposing a portion of the rewiring line 20. The insulating layer 30 has a recessed portion that is recessed from the surface of the insulating layer 30 towards the rewiring line 20, the recessed portion being formed by the recess 43 formed in the second insulating film 32. In the insulating layer 30, the opening (second opening 42) that exposes a portion of the rewiring line 20 is disposed at the bottom of the recess (recess 43). Also, in the semiconductor device 2, the end portion EB in the planar direction of the external connection terminal 50 is disposed on the second inclined surface S2 on the wall surface of the recess 43.

Also, in the semiconductor device 2, the thickness of the insulating layer 30, constituted of the first insulating film 31 and the second insulating film 32, covering the surface of the rewiring line 20 becomes gradually thicker from the end portion E3 of the second opening 42 towards the outside of the second opening 42. In other words, in the insulating layer 30, the thickness of the insulating layer 30 covering the surface of the rewiring line 20 changes continuously from the first inclined surface S1 to the second inclined surface S2 along the inclined surface of the recess 43 formed in the second insulating film 32, and the external connection terminal 50 is disposed in the bottom portion of the recess 43, which is the thinnest portion.

Figure 10A:
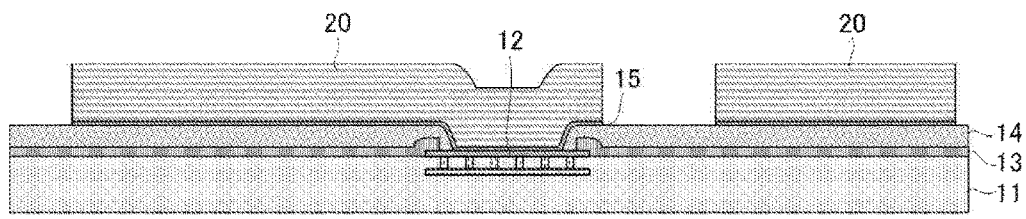
FIG. 10A is a cross-sectional view showing a manufacturing method for a semiconductor device according to another embodiment of the present invention.

Below a manufacturing method for the semiconductor device 2 will be described. FIGS. 10A to 10J are cross-sectional views showing an example of a manufacturing method for the semiconductor device 2. Description of the steps leading up to the formation of the rewiring line 20 are similar to the manufacturing steps for the semiconductor device 1 of Embodiment 1, and thus are omitted here. FIG. 10A is a cross-sectional view of a stage in which formation of the rewiring line 20 has been completed.

Figure 10B:
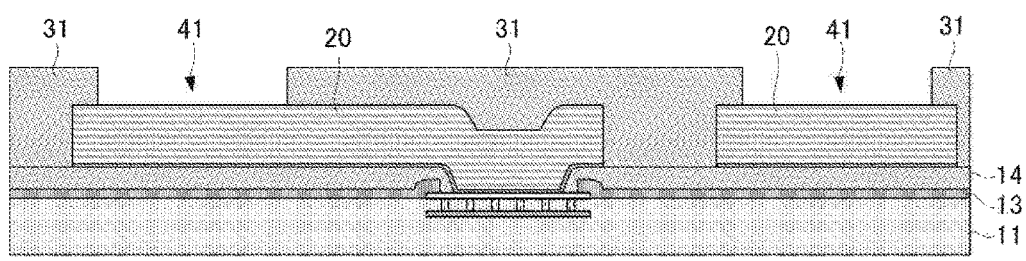
FIG. 10B is a cross-sectional view showing a manufacturing method for a semiconductor device according to another embodiment of the present invention.

After formation of the rewiring line 20 is completed, a photosensitive organic insulating member such as a polyimide or PBO is coated by spin coating onto the surface of the structure formed by the processes leading up to the formation of the rewiring line 20, thereby forming the first insulating film 31 covering the surface of the rewiring line 20 and the surface protective layer 14. Then, by the publicly known photolithography technique, the first opening 41 exposing a portion of the rewiring line 20 is formed in the first insulating film 31. The first insulating film 31 is deposited by spin coating, and thus, a flat surface is formed on the rewiring line 20 (FIG. 10B).

Figure 10C:
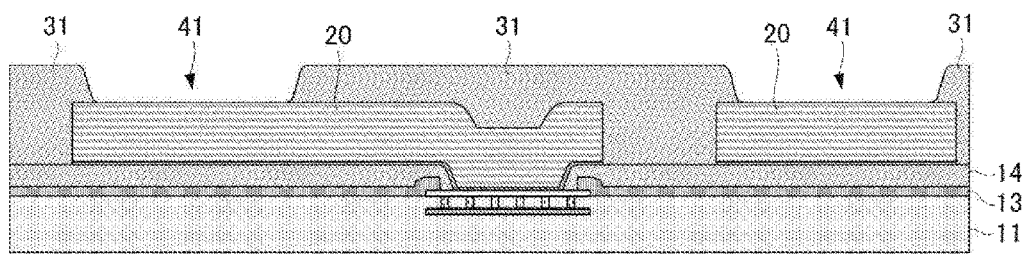
FIG. 10C is a cross-sectional view showing a manufacturing method for a semiconductor device according to another embodiment of the present invention.

Next, by performing heat treatment on the first insulating film 31, the first insulating film 31 is cured. Heat treatment causes thermal contraction of the first insulating film 31, and the side face of the first opening 41, which was substantially vertical prior to curing, becomes an inclined surface that is inclined in a diagonal direction. In other words, the cross-sectional shape of the first opening 41 is a forward tapered shape after curing (FIG. 10C).

Figure 10D:
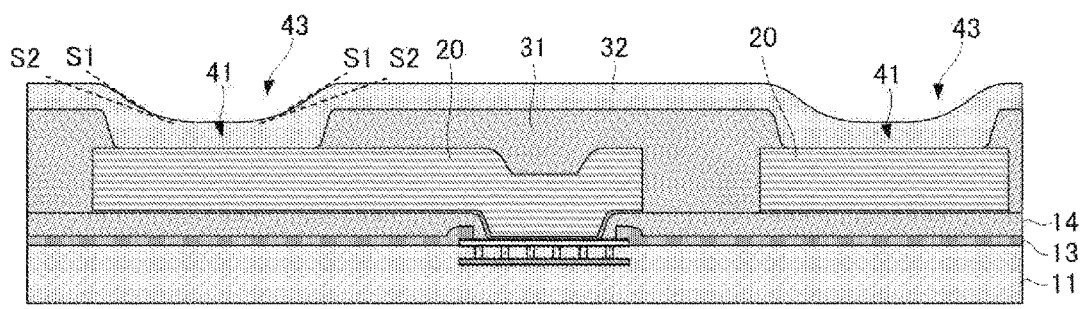
FIG. 10D is a cross-sectional view showing a manufacturing method for a semiconductor device according to another embodiment of the present invention.

Next, a photosensitive organic insulating member such as a polyimide or PBO is coated by spin coating onto the surface of the structure formed by the above processes, thereby forming the second insulating film 32 covering the exposed portion of the first insulating film 31 and the rewiring line 20. The surface of the second insulating film has a recess 43 that is recessed towards the rewiring line 20 in a portion corresponding to the first opening 41. The recess 43 is formed by the second insulating film 32 covering the step formed by the first opening 41, and thus, the wall surface of the recess 43 is a curved inclined surface having the first inclined surface S1 formed along the side face from the top of the first opening 41 of the first insulating film 31, and the second inclined surface S2 formed along the side face of the first insulating film 31 and the surface of the rewiring line 20 (FIG. 10D).

Figure 10E:
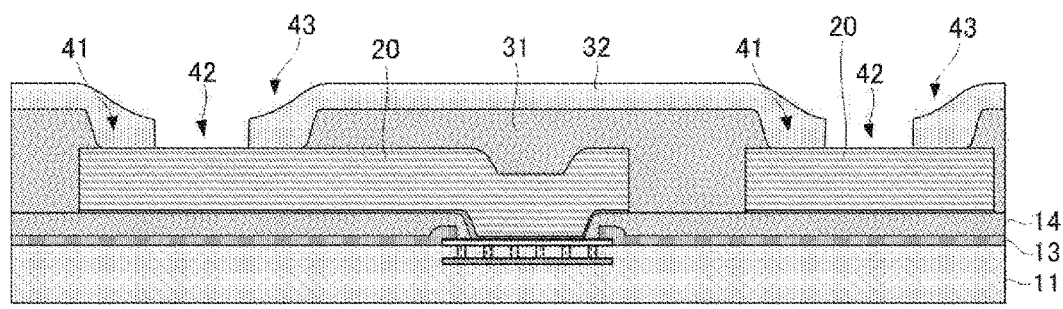
FIG. 10E is a cross-sectional view showing a manufacturing method for a semiconductor device according to another embodiment of the present invention.

Next, by the publicly known photolithography technique, the second opening 42 exposing the surface of the rewiring line 20 at the bottom portion of the recess 43 of the second insulating film 32, is formed. The second opening 42 is formed in a region surrounded by the first opening 41 (FIG. 10E).

Figure 10F:
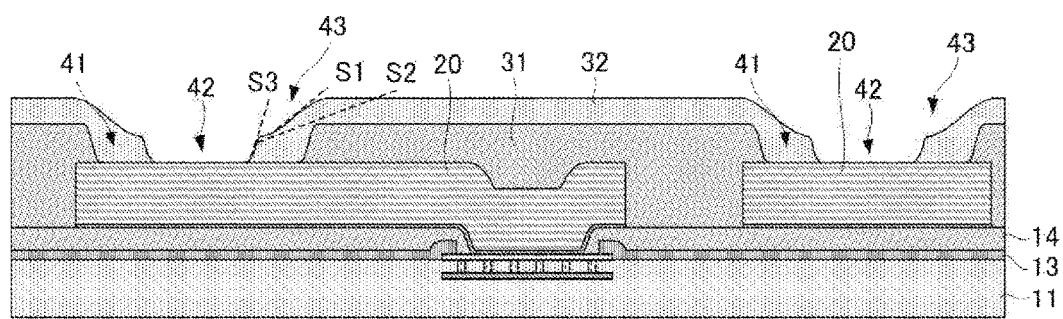
FIG. 10F is a cross-sectional view showing a manufacturing method for a semiconductor device according to another embodiment of the present invention.

Next, by performing heat treatment on the second insulating film 32, the second insulating film 32 is cured. Heat treatment causes thermal contraction of the second insulating film 32, and the side face of the second opening 42, which was substantially vertical prior to curing, becomes an inclined surface that is inclined in a diagonal direction. In other words, the cross-sectional shape of the second opening 42 is a forward tapered shape after curing. Also, three inclined surfaces having different angles of inclination are formed in the second insulating film 32 by the first inclined surface S1 and the second inclined surface S2, which form the wall surface of the recess 43, and the side face of the second opening 42 (FIG. 10F).

Figure 10G:
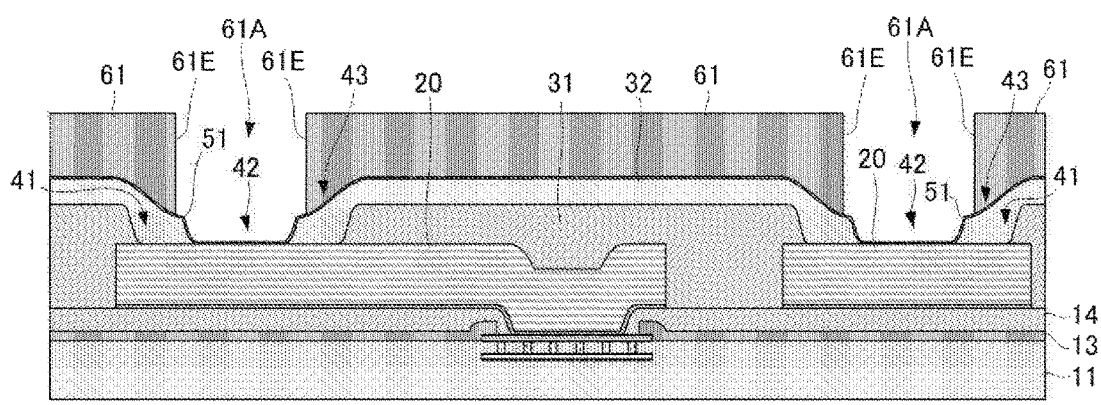
FIG. 10G is a cross-sectional view showing a manufacturing method for a semiconductor device according to another embodiment of the present invention.

Next, by the sputtering method, a Ti film and a Cu film are sequentially deposited on the surface of the structure formed by the processes above, thereby forming the plating seed layer 51 covering the surface of the second insulating film 32, the wall surface of the recess 43, the side face of the second opening 42, and the surface of the rewiring line 20 exposed in the second opening 42. Then, by the publicly known photolithography technique, a resist mask 61 having an opening 61A exposing the exposed portion of the rewiring line 20 is formed. The end portion 61E of the opening 61A of the resist mask 61 is disposed on the second inclined surface S2 that is on the wall surface of the recess 43 where the inclination is relatively shallow (FIG. 10G).

Figure 10H:
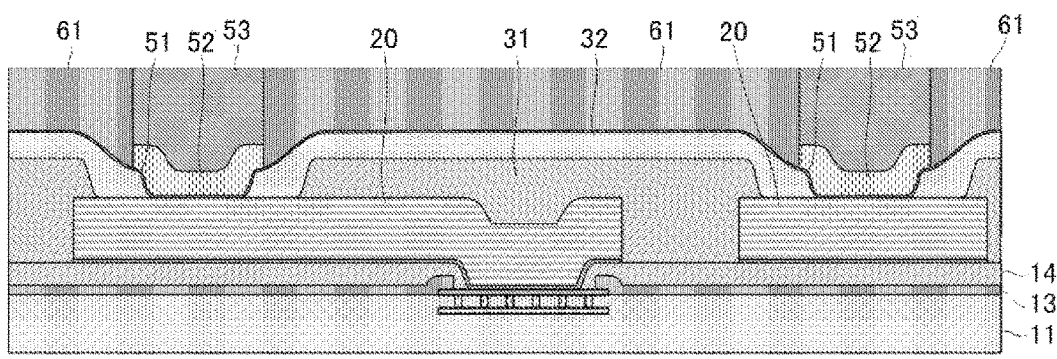
FIG. 10H is a cross-sectional view showing a manufacturing method for a semiconductor device according to another embodiment of the present invention.

Next, the underlayer 52 is formed on the exposed portion of the plating seed layer 51 by electroplating. During the plating process, a cup-shaped plating device that can simultaneously process multiple wafers is used. In the cup-shaped plating device, the surface to be plated is soaked in a plating solution with the surface of the semiconductor substrate 10 to be plated facing downward. If there is a recess in the surface to be plated, an air bubble enters the recessed area, interfering with the plating process. In order to handle this situation, the cup-shaped plating device performs an air bubble-removal sequence to remove air bubbles that have entered the recess as a result of the plating solution being jetted. According to the semiconductor device 2 and the manufacturing method therefor of the present embodiment, the second opening 42 exposing the rewiring line 20 is formed in the bottom portion of the recess 43. As a result, the aspect ratio of the second openings 42 can be made smaller than in conventional configurations. Therefore, air bubbles that have entered the second opening 42 can be easily removed by an air bubble-removal sequence. In this manner, it is possible to reduce the risk of the plating process being performed while air bubbles that have entered the second opening 42 remain. After the air bubble-removal sequence has been completed, a voltage is applied to the plating seed layer 51. As a result, metal is deposited on the exposed portion of the plating seed layer 51, thereby forming the underlayer 52. Ni, for example, can be suitably used as a member for the underlayer 52 (FIG. 10H).

Next, the bump 53 is formed on the underlayer 52 by electroplating. Specifically, the surface of the semiconductor substrate 10 is soaked by plating solution while leaving remaining the resist mask 61 used when forming the underlayer 52, and a voltage is applied to the plating seed layer 51. As a result, metal is deposited on the surface of the underlayer 52, thereby forming the bump 53. Sn—Ag, for example, can be suitably used as a member for the bump 53 (FIG. 10H).

Figure 10I:
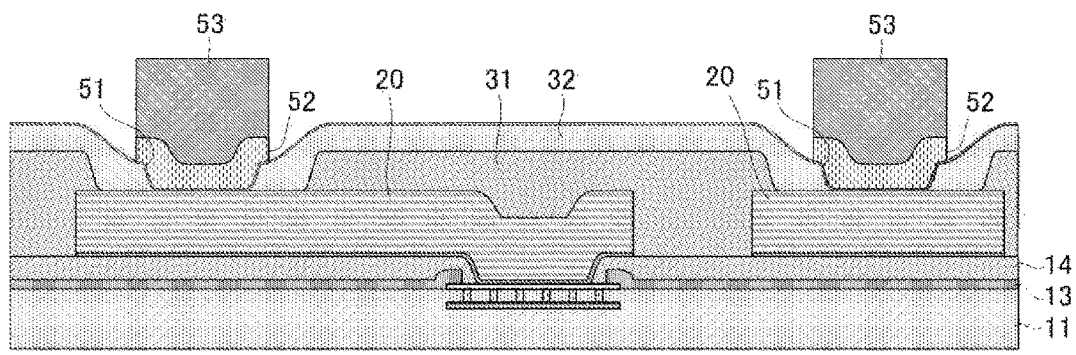
FIG. 10I is a cross-sectional view showing a manufacturing method for a semiconductor device according to another embodiment of the present invention.
Figure 10J:
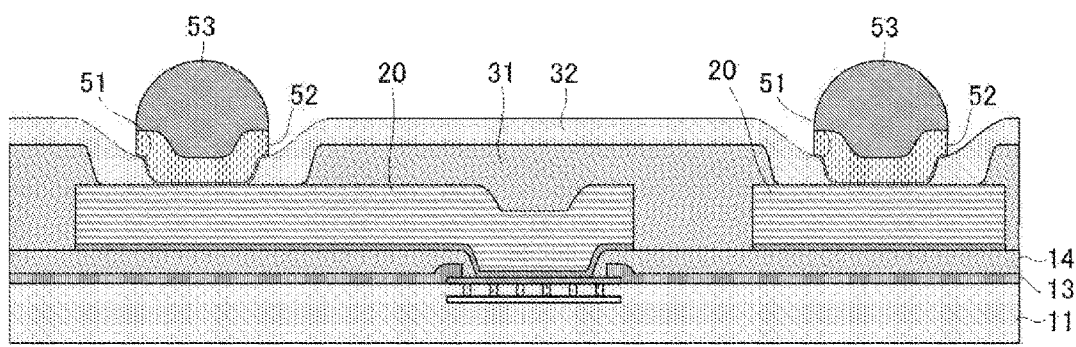
FIG. 10J is a cross-sectional view showing a manufacturing method for a semiconductor device according to another embodiment of the present invention.

Next, the resist mask 61 used during the plating process in order to form the underlayer 52 and the bump 53 is removed (FIG. 10I).

Next, excess plating seed layer remaining on the surface of the second insulating film 32 is removed by etching with the underlayer 52 as a mask. Then, a reflow process is performed and the bump 53 is temporarily melted. As a result, the bump 53 is formed into a ball shape.

According to the semiconductor device 2 and the manufacturing method therefor of the present embodiment, the thickness of the insulating layer 30 covering the surface of the rewiring line 20 is thinner in a portion where the external connection terminal 50 is formed and thicker in other portions. As a result, compared to a case in which the entire insulating layer 30 is formed to be thin, it is possible to increase durability against ion migration.

Also, according to the semiconductor device 2 and the manufacturing method therefor of the present embodiment, the second opening 42 exposing the rewiring line 20 is formed in the bottom portion of the recess 43 formed in the second insulating film 32. As a result, the aspect ratio of the second openings 42 can be made smaller than in conventional configurations. Therefore, it becomes easy to remove air bubbles that have entered the second opening 42 by the air bubble-removal sequence, and it is possible to reduce the risk of the plating process being performed while air bubbles that have entered the second opening 42 remain. Also, by the air bubbles being reliably removed, it is possible to form a normal underlayer 52 by the plating process.

Also, according to the semiconductor device 2 and the manufacturing method therefor of the present embodiment, the insulating layer 30 at a portion where the second opening 42 exposing the rewiring line 20 is formed is made to be thinner than in conventional configurations. In this manner, it is possible to increase the exposure margin when forming the second opening 42 and to mitigate the occurrence of opening defects. Thus, it is possible to stabilize the contact resistance between the external connection terminal 50 and the rewiring line 20.

Also, according to the semiconductor device 2 and the manufacturing method therefor of the present embodiment, the insulating layer 30 has the second opening 42, which exposes the rewiring line 20 at the bottom of the recess 43 formed in the second insulating film 32. In this manner, by using a two-step structure including the recess 43 formed in the second insulating film 32 and the second opening 42 for the opening that spans from the surface of the insulating layer 30 to the rewiring line 20, it is possible to dispose the end portion EB in the planar direction of the external connection terminal 50 on the inclined surface S2 of the wall surface of the recess 43. In this manner, it is possible to set the distance between the end portion E3 in the planar direction of the second opening 42, which exposes the rewiring line 20, and the end portion EB in the planar direction of the external connection terminal 50, so as to be longer than in conventional configurations. As a result, the portion of the plating seed layer 51 that covers the side face of the second opening 42 is not exposed to the etching solution for removing the plating seed layer 51, and thus, it is possible to mitigate complete elimination of the plating seed layer 51.

Also, according to the semiconductor device 1 and the manufacturing method therefor of the present embodiment, the contact area between the insulating layer 30 and the external connection terminal 50 is less than in conventional configurations, and thus, the effect of expansion and contraction of the insulating layer 30 resulting from changes in the surrounding temperature on the external connection terminal 50 is reduced. In this manner, it is possible to suppress peeling of the external connection terminal 50. Thus, it is possible to improve the long-term reliability of the semiconductor device 1.

According to the semiconductor device 2 of Embodiment 2, it is possible to set the thickness of the insulating layer 30 where the external connection terminal 50 is formed to be less than in the semiconductor device 1 of Embodiment 1, and thus, better effects (improvement in air bubble removal, mitigation of opening defects, mitigation of loss of the plating seed layer, and mitigation of peeling of the external connection terminal) can be attained than in the semiconductor device 1 of Embodiment 1.

Figure 11:
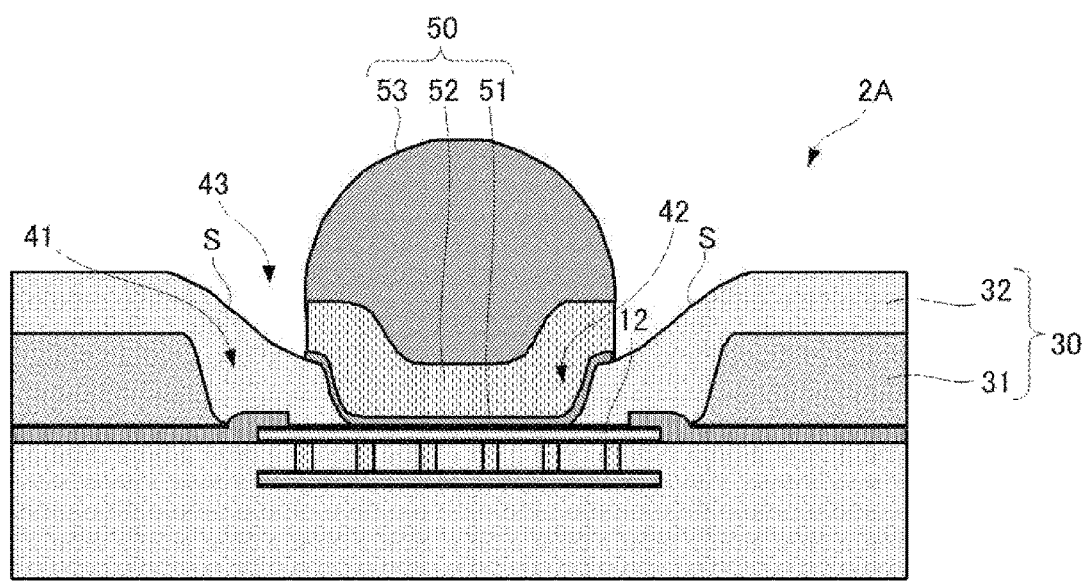
FIG. 11 is a cross-sectional view showing a configuration of a peripheral region of the external connection terminal in the semiconductor device according to another embodiment of the present invention.

FIG. 11 is a cross-sectional view showing a configuration of a peripheral region of an external connection terminal of the semiconductor device 2A according to a modification example. The semiconductor device 2A of the modification example differs from the semiconductor device 2 (see FIG. 9) in that the external connection terminal 50 is connected to the electrode pad 12. Even in the semiconductor device 2A having such a configuration in which the external connection terminal 50 is connected to the electrode pad 12, similar effects to the above-mentioned semiconductor device 2 can be attained.

In Embodiments 1 and 2, semiconductor devices having microbumps with a diameter of 8 μm to 15 μm, inclusive, as the external connection terminal were illustrated, but it is also possible to apply the present invention to semiconductor devices having normal size bumps with a diameter of greater than 15 μm.

What is claimed is:
1. A semiconductor device, comprising:
a semiconductor substrate;
a conductor provided on a main surface of the semiconductor substrate;
an insulating layer disposed to cover a surface of the conductor and having a recess from a surface thereof towards the conductor, the recess having an opening provided at a bottom portion of the recess and exposing a portion of the conductor; and
an external connection terminal connected to the portion of the conductor exposed from the opening, wherein
in a plan view of the semiconductor device, the external connection terminal covers the entire opening, and the entire external connection terminal is within the recess.
2. The semiconductor device according to claim 1, wherein the recess has a side face in an area other than the opening, the sidewall having a curved inclined surface or a stepwise surface.
3. The semiconductor device according to claim 1, wherein the insulating layer includes a first insulating film and a second insulating film.
4. The semiconductor device according to claim 3, wherein the first insulating film is disposed to cover the surface of the conductor and has as the opening a first opening that exposes the portion of the conductor, and the second insulating film is disposed on the first insulating film and has a second opening that exposes a portion of the first insulating film including the entire first opening, the recess being formed by the second opening and a portion of the first insulating film that is exposed from the second opening.

5. The semiconductor device according to claim 4, wherein the external connection terminal is disposed in the first opening and partially on the portion of the first insulating film that is exposed by the second opening.

6. The semiconductor device according to claim 4, wherein the external connection terminal includes a seed layer disposed on the portion of the conductor exposed by the first opening, a sidewall of the first opening, and partially on the portion of the first insulating film exposed by the second opening, an underlayer disposed on the seed layer, and a bump disposed on the underlayer.

7. The semiconductor device according to claim 3, wherein the first insulating film is disposed to cover the surface of the conductor and has a first opening that exposes the portion of the conductor, the second insulating film is disposed on the first insulating film, has the recess in a portion corresponding to the first opening of the first insulating film, and has as the opening a second opening that exposes the portion of the conductor at the bottom portion of the recess.

8. The semiconductor device according to claim 7, wherein the recess has a sidewall surface in an area other than the opening, the sidewall surface being a curved inclined surface.

9. The semiconductor device according to claim 7, wherein the recess has a sidewall surface in an area other than the opening, the sidewall surface including a first inclined surface and a second inclined surface that has an angle of inclination smaller than an angle of inclination of the first inclined surface, and the external connection terminal is formed on the second inclined surface.

10. The semiconductor device according to claim 4, wherein the recess has a sidewall in an area other than the opening, the external connection terminal includes a seed layer disposed on the portion of the conductor exposed by the second opening, a sidewall of the second opening, and partially on the portion of the sidewall of the recess, an underlayer disposed on the seed layer, and a bump deposed on the underlayer.

11. The semiconductor device according to claim 1, wherein a diameter of the external connection terminal in the plan view is in a range of 8 μm to 15 μm.

12. A manufacturing method for a semiconductor device, comprising:

forming an insulating layer covering a surface of a conductor provided on a main surface of a semiconductor substrate;

forming, in the insulating layer, an opening that exposes a portion of the conductor;

forming a recess that is recessed towards the conductor from a surface of the insulating layer, a bottom portion of the recess including an entire area of the opening; and forming an external connection terminal connected to the portion of the conductor exposed by the opening, wherein in a plan view of the semiconductor device, the external connection terminal is formed to cover the entire opening, and to be within the recess.

13. The manufacturing method according to claim 12, wherein forming the insulating layer includes:

forming a first insulating film covering a surface of the conductor;

forming, as the opening in the first insulating film, a first opening that exposes the portion of the conductor to be contacted by the external connection terminal;

forming a second insulating film on the first insulating film; and forming a second opening in the second insulating film that exposes a portion of the first insulating film in which the entire first opening is included, the recess being formed by a sidewall surface of the second opening and a portion of the first insulating film that is exposed by the second opening.

14. The manufacturing method according to claim 12, wherein forming the insulating layer includes:

forming a first insulating film covering a surface of the conductor;

forming, in the first insulating film, a first opening that exposes an area including the entire portion of the conductor to be contacted by the external connection terminal;

forming a second insulating film on the first insulating film, and forming the recess in a portion of the second insulating film corresponding to the first opening; and forming, as the opening in a bottom portion of the recess, a second opening that exposes the portion of the conductor to be contacted by the external connection terminal.

15. The manufacturing method according to claim 14, wherein the recess is formed due to a step coverage when the second insulating film is formed on the first opening.

16. The manufacturing method according to claim 12, the external connection terminal has a bump, a size of which is in a rage of 8 μm to 15 μm.

* * * * *